United States Patent
Doan et al.

(10) Patent No.: US 8,933,467 B2
(45) Date of Patent: Jan. 13, 2015

(54) SMART INTEGRATED SEMICONDUCTOR LIGHT EMITTING SYSTEM INCLUDING NITRIDE BASED LIGHT EMITTING DIODES (LED) AND APPLICATION SPECIFIC INTEGRATED CIRCUITS (ASIC)

(75) Inventors: Trung Tri Doan, Baoshan Hsinchu (TW); Tien Wei Tan, Penang (MY); Wen-Huang Liu, Hsinchu County (TW); Chen-Fu Chu, Hsinchu (TW); Yung Wei Chen, Taichung (TW)

(73) Assignee: SemiLEDS Optoelectronics Co., Ltd., Chu-nan (TW)

( * ) Notice: Subject to any disclaimer, the term of this patent is extended or adjusted under 35 U.S.C. 154(b) by 216 days.

(21) Appl. No.: 13/309,718

(22) Filed: Dec. 2, 2011

(65) Prior Publication Data
US 2012/0091466 A1    Apr. 19, 2012

Related U.S. Application Data

(63) Continuation-in-part of application No. 12/540,523, filed on Aug. 13, 2009, now Pat. No. 8,084,780.

(51) Int. Cl.
*H01L 31/12* (2006.01)
*H01L 25/16* (2006.01)

(52) U.S. Cl.
CPC ..... *H01L 25/167* (2013.01); *H01L 2224/48091* (2013.01); *H01L 2224/48464* (2013.01); *H01L 2924/13091* (2013.01)
USPC ......... 257/84; 257/99; 257/676; 257/E25.032

(58) Field of Classification Search
None
See application file for complete search history.

(56) References Cited

U.S. PATENT DOCUMENTS

| | | | |
|---|---|---|---|
| 6,014,119 A | 1/2000 | Staring et al. | |
| 6,288,417 B1 * | 9/2001 | Nickel et al. | 257/103 |
| 6,332,661 B1 | 12/2001 | Yamaguchi | |
| 6,335,548 B1 * | 1/2002 | Roberts et al. | 257/98 |
| 6,555,405 B2 | 4/2003 | Chen et al. | |
| 6,836,081 B2 | 12/2004 | Swanson et al. | |
| 7,144,759 B1 * | 12/2006 | Hilton et al. | 438/108 |
| 7,186,580 B2 | 3/2007 | Tran et al. | |
| 7,195,944 B2 | 3/2007 | Tran et al. | |

(Continued)

OTHER PUBLICATIONS

Avago Data Sheet Description, APDS-9701, Feb. 3, 2011.*

(Continued)

*Primary Examiner* — Tan N Tran
*Assistant Examiner* — Scott R Wilson
(74) *Attorney, Agent, or Firm* — Stephen A. Gratton

(57) ABSTRACT

A light emitting diode (LED) system includes a substrate, an application specific integrated circuit (ASIC), and at least one light emitting diode (LED) that includes a Group-III nitride based material such as GaN, InGaN, AlGaN, AlInGaN or other (Ga, In or Al) N-based materials. The light emitting diode (LED) system can also include a polymer lens, and a phosphor layer on the lens or light emitting diode (LED) for producing white light. In addition, multiple light emitting diodes (LEDs) can be mounted on the substrate, and can have different colors for smart color control lighting. The substrate and the application specific integrated circuit (ASIC) are configured to provide an integrated LED circuit having smart functionality. In addition, the substrate is configured to compliment and expand the functions of the application specific integrated circuit (ASIC), and can also include built in integrated circuits for performing additional electrical functions.

18 Claims, 15 Drawing Sheets

(56) References Cited

U.S. PATENT DOCUMENTS

| | | | |
|---|---|---|---|
| D568,831 S | 5/2008 | Kim | |
| 7,378,288 B2 | 5/2008 | Tran et al. | |
| 7,413,918 B2 | 8/2008 | Tran et al. | |
| 7,432,119 B2 | 10/2008 | Doan | |
| 7,473,935 B2 | 1/2009 | Chen et al. | |
| 7,473,936 B2 | 1/2009 | Tran et al. | |
| 7,474,288 B2 | 1/2009 | Smith et al. | |
| 7,518,158 B2 | 4/2009 | Keller et al. | |
| 7,524,686 B2 | 4/2009 | Chu et al. | |
| 7,528,551 B2 | 5/2009 | Ball | |
| 7,563,625 B2 | 7/2009 | Tran et al. | |
| 7,723,718 B1 | 5/2010 | Doan et al. | |
| 8,084,780 B2 | 12/2011 | Doan et al. | |
| 2002/0171087 A1* | 11/2002 | Krames et al. | 257/81 |
| 2006/0151801 A1 | 7/2006 | Doan et al. | |
| 2006/0154393 A1 | 7/2006 | Doan et al. | |
| 2008/0315230 A1* | 12/2008 | Murayama | 257/98 |
| 2009/0133251 A1* | 5/2009 | Tuominen et al. | 29/829 |
| 2010/0012957 A1* | 1/2010 | Lin et al. | 257/98 |
| 2011/0024627 A1* | 2/2011 | Yao | 250/338.4 |
| 2012/0168714 A1 | 7/2012 | Chu et al. | |
| 2012/0168716 A1 | 7/2012 | Chu et al. | |

OTHER PUBLICATIONS

Office Action from U.S. Appl. No. 12/540,523 dated Apr. 28, 2011, pp. 1-13.
Notice of Allowance from U.S. Appl. No. 12/540,523 dated Aug. 3, 2011, pp. 1-5.
U.S. Appl. No. 12/983,436, "Vertical Light Emitting Diode (VLED) and Method of Fabrication", filed Jan. 3, 2011, pp. 1-23.

* cited by examiner

US 8,933,467 B2

SMART INTEGRATED SEMICONDUCTOR LIGHT EMITTING SYSTEM INCLUDING NITRIDE BASED LIGHT EMITTING DIODES (LED) AND APPLICATION SPECIFIC INTEGRATED CIRCUITS (ASIC)

CROSS REFERENCE TO RELATED APPLICATIONS

This application is a continuation-in-part of Ser. No. 12/540,523, filed on Aug. 13, 2009, U.S. Pat. No. 8,084,780 B2.

BACKGROUND

This disclosure relates generally to light emitting diodes (LED) and more particularly to systems incorporating light emitting diodes (LEDs).

Light emitting diodes (LEDs) are used in a wide range of electronic devices such as displays, communication devices, and lamps. Advances in LED technology have improved the efficiency and service life of light emitting diodes (LEDs), and have made them smaller and lighter. However, most advances have been directed to the structure and function of the light emitting diodes (LEDs), rather than the associated LED systems. Light emitting diodes (LEDs) are typically part of a LED system that includes driver circuitry and associated electronic devices such as resistors, capacitors, diodes and circuit boards.

FIG. 1 illustrates a prior art LED circuit 10. The prior art LED system 10 includes a LED driver IC 12, and two light emitting diode (LED) chips 14 in electrical communication with the LED driver IC chip 12. The LED driver IC 12 is configured to provide driver and functionality circuits for the light emitting diode (LED) chips 14. The LED driver IC 12 includes a VIN pin, a SEN pin, a DIM pin, a SW pin and a GND pin. The LED system 10 also includes various electronic components including resistors, capacitors, a Schottky diode, and an inductor configured substantially as shown. The LED system 10 requires a relatively complex manufacturing process to mount and interconnect all of the electronic elements. In addition, relatively large amounts of current and power are required to drive the electronic elements, which generates a large amount of heat.

In view of the foregoing, improved LED systems are needed in the art, which are more efficient than prior art LED systems. However, the foregoing examples of the related art and limitations related therewith, are intended to be illustrative and not exclusive. Other limitations of the related art will become apparent to those of skill in the art upon a reading of the specification and a study of the drawings.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

DETAILED DESCRIPTION

Figure 2:
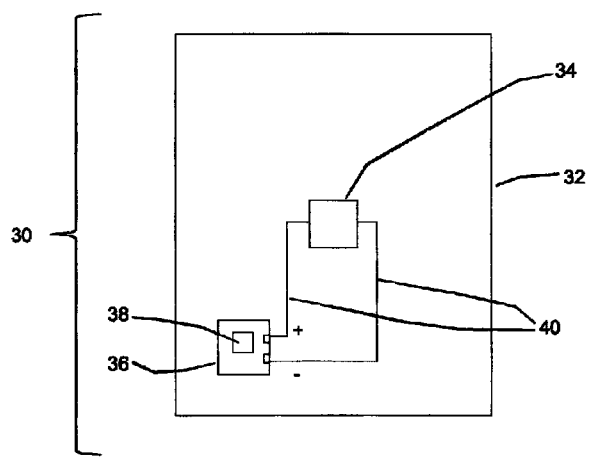
FIG. 2 is a schematic plan view of a LED system having integrated components and smart functionality.

Referring to FIG. 2, a LED system 30 includes a substrate 32, a light emitting diode (LED) 34 mounted to the substrate 32, and an application specific integrated circuit (ASIC) die 36 mounted to the substrate 32 in electrical communication with the light emitting diode (LED) 34. Although the LED system 30 includes only one application specific integrated circuit (ASIC) die 36, it is to be understood that the LED system can include a plurality of application specific integrated circuit (ASIC) dice 36. The substrate 32 functions as a mounting substrate, and also provides functionality for operating the light emitting diode (LED) 34 and the application specific integrated circuit (ASIC) die 36 as an integrated assembly. The light emitting diode (LED) 34 can comprise a conventional LED fabricated using known processes. Suitable light emitting diodes (LEDs) are commercially available from SEMILEDS, INC. located in Boise, Id., and Miao-Li County, Taiwan, R.O.C. The application specific integrated circuit (ASIC) die 36 can comprise a semiconductor die having application specific integrated circuits 38 formed therein.

The light emitting diode (LED) 34 can comprise a Group-III nitride based material such as GaN, InGaN, AlGaN, AlInGaN or other (Ga, In or Al) N-based materials. In addition, the doped and active layers of the light emitting diode (LED) 34 can be formed on a carrier substrate made of a suitable material such as silicon (Si), silicon carbide (SiC) or sapphire ($Al_2O_3$). For example, SEMILEDS, INC. manufactures ultra thin vertical light emitting diodes (VLED) under the trademark MvpLED™. U.S. Pat. No. 7,723,718, entitled "Epitaxial Structure For Metal Devices", which is incorporated herein be reference, discloses methods for fabricating vertical light emitting diodes (VLED).

Figure 13:
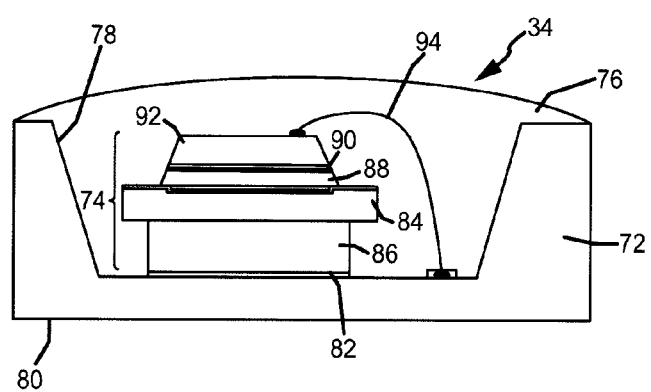
FIG. 13 is a schematic cross sectional view of a light emitting diode (LED) of the LED system.

Referring to FIG. 13, the light emitting diode (LED) 34 is shown separately. However, it is to be understood that this configuration for the light emitting diode (LED) 34 is merely exemplary, and other configurations can be employed. The light emitting diode (LED) 34 includes a device substrate 72, a vertical light emitting diode (VLED) die 74 mounted to the device substrate 74, and an electrically insulating, light transmissive passivation layer 76 which encapsulates the light emitting diode (VLED) die 74. For illustrative purposes in FIG. 13, the light emitting diode (LED) 34 is shown with only one vertical light emitting diode (VLED) die 74 mounted to the device substrate 74. However, in actual practice the light emitting diode (LED) 34 can include a plurality of vertical light emitting diode (VLED) dice 74 mounted to the device substrate 72, and arranged in a desired array to form an optoelectronic device, such as an LED display. The device substrate 72 can comprise a semiconductor material, such as silicon (Si), or another material, such GaAs, SiC, AlN, $Al_2O_3$, or sapphire. The device substrate 72 can include a cavity 78 wherein the vertical light emitting diode (VLED) die 74 is mounted, and a back side 80. An electrically conductive die attach layer 82 can be used to attach the vertical light emitting diode (VLED) die 74 to the substrate 72.

Still referring to FIG. 13, the vertical light emitting diode (VLED) die 74 can be fabricated as disclosed in U.S. application Ser. No. 12/983,436 entitled "Vertical Light Emitting Diode (VLED) Die And Method Of Fabrication", which is incorporated herein by reference. The vertical light emitting diode (VLED) die 74 includes a first metal 84; a second metal 86; a p-type semiconductor layer 88 on the first metal 84; a multiple quantum well (MQW) layer 90 on the p-type semiconductor layer 88; and an n-type semiconductor layer 92 on the multiple quantum well (MQW) layer 90. A preferred material for the p-type semiconductor layer 88 comprises p-GaN. Other suitable materials for the p-type semiconductor layer 88 include AlGaN, InGaN and AlInGaN. A preferred material for the n-type semiconductor layer 92 comprises p-GaN. Other suitable materials for the n-type semiconductor layer 92 include AlGaN, InGaN and AlInGaN. The multiple quantum well (MQW) layer 90 can comprise a semiconductor material, such as GaAs, sandwiched between two layers of a semiconductor material, such as AlAs having a wider bandgap. Wire bonded wires 94 electrically connect the n-type semiconductor layer 92 to electrodes on the substrate 72 and the vertical light emitting diode (VLED) die 74.

Referring again to FIG. 2, the substrate 32 includes a front side (circuit side) having conductors 40 formed thereon, which electrically connect the application specific integrated circuit (ASIC) die 36 to the light emitting diode (LED) 34. As will be further explained, the application specific integrated circuit (ASIC) die 36 and the light emitting diode (LED) 34 can be mounted to the substrate using a suitable technique such as flip chip or C4 bonding. The substrate 32 can comprise silicon, or another semiconductor material such as gallium arsenide, and the conductors 40 can be fabricated using well known semiconductor fabrication processes. As another example, the substrate 32 can comprise silicon carbide (SiC) or sapphire ($Al_2O_3$). Alternately, the substrate 32 can comprise a ceramic material, a printed circuit board (PCB) material, a metal core printed circuit board (PCB), an FR-4 printed circuit board (PCB), a metal lead frame, an organic lead frame, a silicon submount substrate, or any packaging substrate used in the art.

The substrate 32 can have any polygonal shape (e.g., square, rectangular) and any suitable size. In addition, the substrate 32 can be die-sized, such that the LED system 30 has a chip scale size similar to that of a chip scale package (CSP) or a system on a chip (COS). Alternately, the substrate 32 can be wafer sized such that a wafer scale system is provided.

Figure 3:
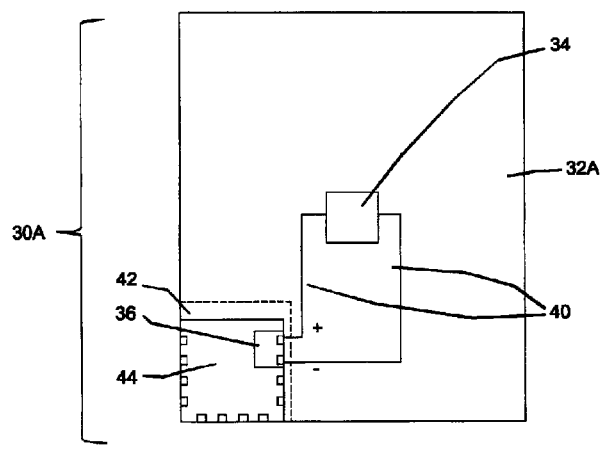
FIG. 3 is a schematic plan view of the LED system having additional functionality built into a semiconductor substrate.

Referring to FIG. 3, an alternate embodiment LED system 30A is substantially similar to the LED system 30 (FIG. 2), but includes a substrate 32A configured to provide additional electrical functionality. In particular, the substrate 32A comprises a semiconductor material having a segment 42 formed with application specific integrated circuits (ASICs) 44 configured to perform additional electrical functions. The application specific integrated circuits (ASICs) 44 can include semiconductor components, circuits, and base materials integrated into the substrate 32A. For example, the application specific integrated circuits (ASICs) 44 can include resistors, diodes (p-n), capacitors, gates, metal-oxide field effect transistors (MOSFET), and flip flops. The application specific integrated circuits (ASICs) 44 can be combined with the integrated circuits in the application specific integrated circuit (ASIC) die 36 to provide smart on-board control of the light emitting diode (LED) 34.

The semiconductor substrate 32A can comprise a portion of a semiconductor wafer having the application specific integrated circuits (ASICs) 44 formed therein using conventional semiconductor fabrication techniques such as implanting, photopatterning. The light emitting diode (LED) 34 can be mounted to a blank portion of the substrate 32A spaced from the application specific integrated circuits (ASICs) 44, and electrically connected to the application specific integrated circuits (ASICs) 44 using suitable connecting elements and interconnects.

Figure 4:
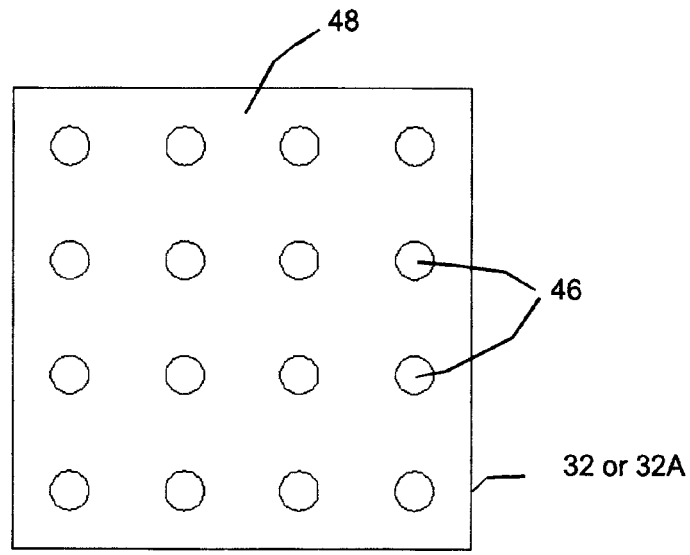
FIG. 4 is a schematic bottom view of the LED system showing circuitry on the substrate.

As shown in FIG. 4, the substrate 32 or 32A includes a back side 48 having an array of contacts 46 in electrical communication with the application specific integrated circuit (ASIC) die 36 (FIG. 2), and with the application specific integrated circuits (ASICs) 44 (FIG. 3). The contacts 46 function as the terminal contacts for connecting the LED system 30 (FIG. 2) or 30A (FIG. 3) to the outside world including other electronic devices and circuitry. The contacts 46 can comprise bumps or pads made of a bondable material such as solder, metal or a conductive polymer, configured for bonding to corresponding electrodes on a module substrate, circuit board or other support substrate. In addition, the contacts 46 can be arranged in a suitable dense area array, such as a ball grid array (BGA) or fine ball grid array (FBGA). Further, the contacts 46 can be electrically connected to the application specific integrated circuit (ASIC) die 36 (FIG. 2) and to the application specific integrated circuits (ASICs) 44 (FIG. 3) using suitable elements, such as interconnects, conductive traces, redistribution conductors and conductive vias formed on the substrate 32 or 32A.

The contacts 46 can be configured to integrate and expand the electrical functions of the application specific integrated circuit (ASIC) die 36 (FIG. 2), the application specific integrated circuits (ASICs) 44 (FIG. 3), and the light emitting diode (LED) 34 (FIG. 2), and to provide smart control for the LED system 30 (FIG. 2) or 30A (FIG. 3). For example, the contacts 46 can be configured as: a.) multi purpose input-output ports; b.) power inputs (AC or DC) for driving the LED system 30 or 30A; c.) dimming control ports; d.) current setting ports; e.) feedback sensor ports; f.) communication ports; and g.) common ground ports. In addition, the application specific integrated circuits (ASICs) 44 (FIG. 3), and the light emitting diode (LED) 34 (FIG. 2) form an integrated LED circuit.

Figure 5:
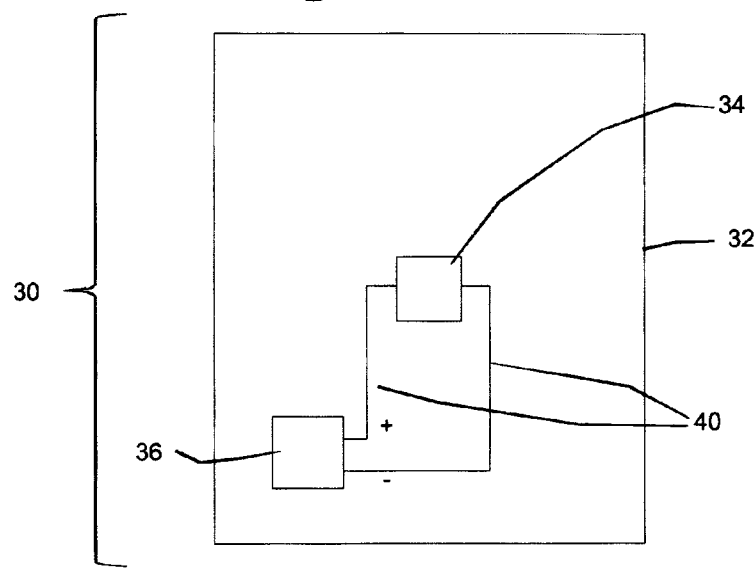
FIG. 5 is a schematic plan view of the LED system equivalent to FIG. 2.
Figure 5A:
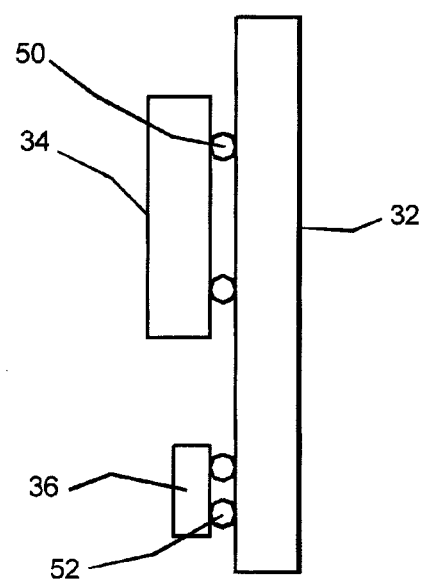
FIG. 5A is a schematic side elevation view of FIG. 5 illustrating a first mounting arrangement for an application specific integrated circuit (ASIC) and (LED) chip on the substrate.
Figure 5B:
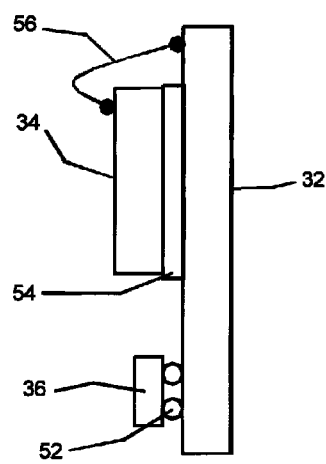
FIG. 5B is a schematic side elevation view of FIG. 5 illustrating a second mounting arrangement for an application specific integrated circuit (ASIC) and (LED) chip on the substrate.

Referring to FIGS. 5, 5A and 5B, an exemplary mounting arrangement for mounting the light emitting diode (LED) 34 and the application specific integrated circuit (ASIC) die 36 to the substrate 32 in LED system 30 are illustrated. In FIG. 5A, the LED chip 34 has a p-, n-same side configuration and is mounted in a chip-on-board (COB) configuration using interconnects 50, and a flip chip bonding method such as C4 (controlled collapse chip connection). Similarly, the application specific integrated circuit (ASIC) die 36 includes interconnects 52 and is flip chip mounted to the substrate 32 in a chip on board configuration. In FIG. 5B, the LED chip 34 has a p-, n-different side configuration and is mounted to the substrate 32 using a die attach bonding layer 54 (e.g., solder, silver epoxy), and a wire bonded wire 56 bonded to contacts on the LED chip 34 and the substrate 32.

Figure 6:
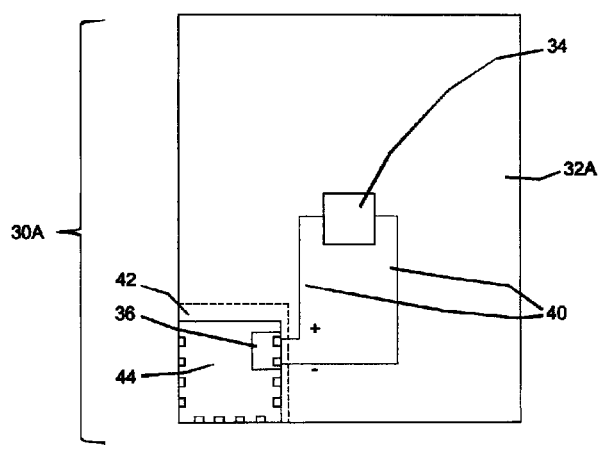
FIG. 6 is a schematic plan view of the LED system having additional functionality equivalent to FIG. 3.
Figure 6A:
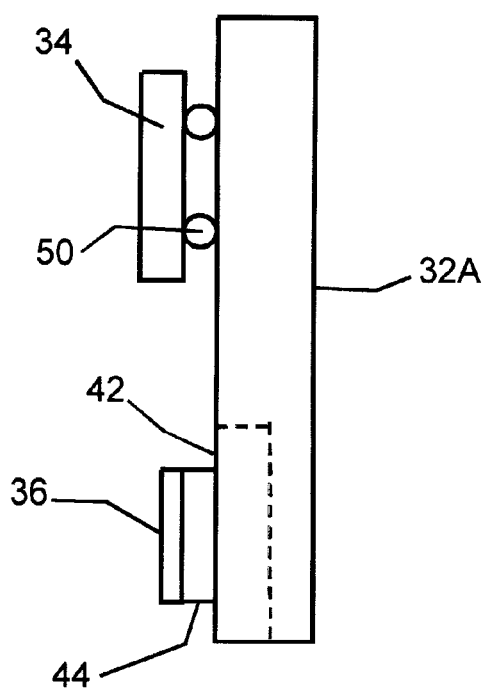
FIG. 6A is a schematic side elevation view of FIG. 6 illustrating a first mounting arrangement for an application specific integrated circuit (ASIC) and (LED) chip on the substrate.
Figure 6B:
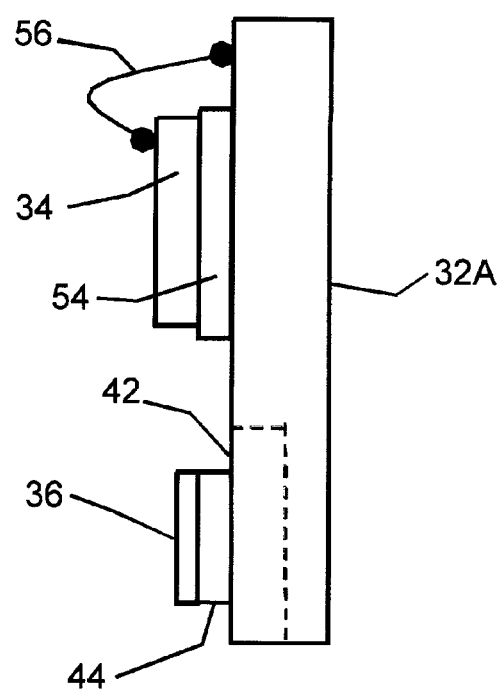
FIG. 6B is a schematic side elevation view of FIG. 6 illustrating a second mounting arrangement for an application specific integrated circuit (ASIC) and (LED) chip on the substrate.

Referring to FIGS. 6, 6A and 6B, an exemplary mounting arrangement for mounting the light emitting diode (LED) 34 and the application specific integrated circuit (ASIC) die 36 to the substrate 32A in LED system 30A are illustrated. In FIG. 6A, the LED chip 34 has a p-, n-same side configuration and is mounted in a chip-on-board (COB) configuration using interconnects 50, and a flip chip bonding method such as C4 (controlled collapse chip connection). The application specific integrated circuit (ASIC) die 36 can be flip chip mounted to the application specific integrated circuits 44 on the substrate 32A in a chip on board configuration substantially as previously described. In FIG. 6B, the LED chip 34 has a p-, n-different side configuration and is mounted to the substrate 32A using a die attach bonding layer 54 (e.g., solder, silver epoxy), and a wire bonded wire 56 bonded to contacts on the LED chip 34 and the substrate 32A.

Figure 7:
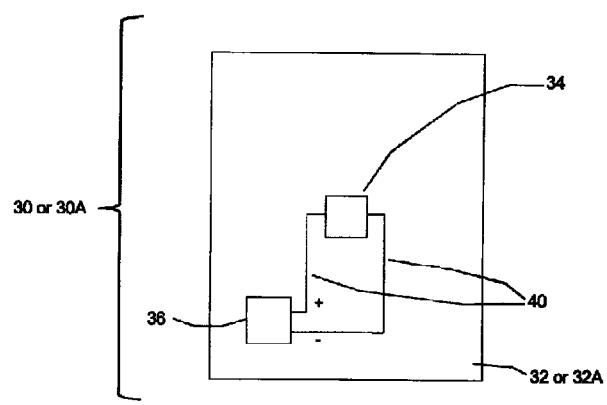
FIG. 7 is a schematic plan view of the LED system equivalent to FIG. 2 or FIG. 3.
Figure 7A:
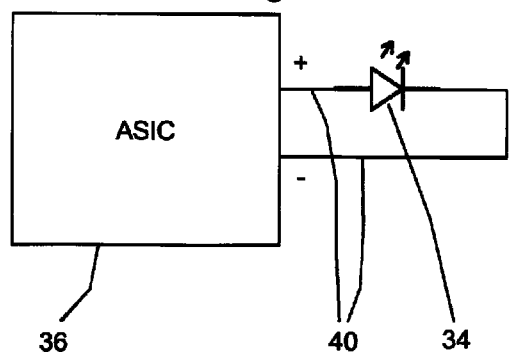
FIG. 7A is a schematic electrical diagram of the LED system of FIG. 7.

Referring to FIGS. 7 and 7A, an exemplary electrical configuration for the application specific integrated circuit (ASIC) die 36 and the light emitting diode (LED) 34 for the LED system 30 or 30A are illustrated. As shown in FIG. 7A, the light emitting diode (LED) 34 can be electrically connected via the conductors 40 to ground pins on the application specific integrated circuit (ASIC) die 36. Alternately, the light emitting diode (LED) 34 can be connected to a dedicated ground pin on the substrate 32 or 32A.

Figure 8:
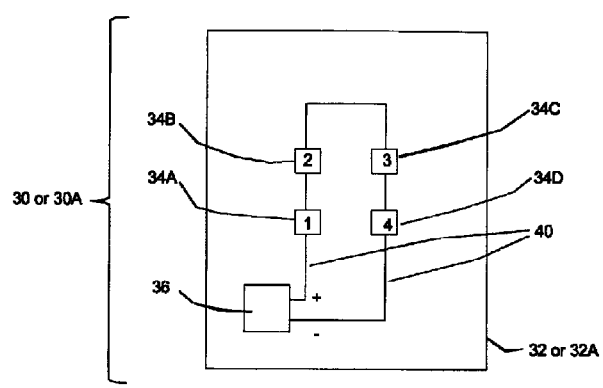
FIG. 8 is a schematic plan view of the LED system having multiple LED chips electrically connected in series.
Figure 8A:
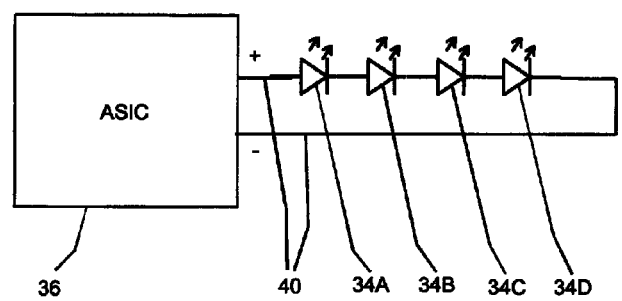
FIG. 8A is a schematic electrical diagram of the LED system of FIG. 8.

Referring to FIGS. 8 and 8A, the LED system 30 or 30A can also include multiple light emitting diodes (LEDs) 34A-34D mounted directly to the substrate 32 or 32A. The light emitting diodes (LEDs) 34A-34D can all be configured to produce the same wavelengths and colors of light (e.g., red, green, blue, white, UV, laser, IR), or can be configured to produce different combinations thereof. For example, a first light emitting diode (LED) 34A can produce white light, a second light emitting diode (LED) 34B can produce green light, a third light emitting diode (LED) 34C can produce blue light, and a fourth light emitting diode (LED) 34D can produce red light. In addition, the application specific integrated circuit (ASIC) die 36, and the application specific integrated circuits 44 (FIG. 3) can be adapted to provide smart color control for the light emitting diodes (LEDs) 34A-34D. As shown in FIG. 8A, the light emitting diodes (LEDs) 34A-34D can be electrically connected in series and grounded to ground pins on the application specific integrated circuit (ASIC) die 36. Alternately, the light emitting diodes (LEDs) 34A-34D can be connected to a dedicated ground pin on the substrate 32 or 32A.

Figure 9:
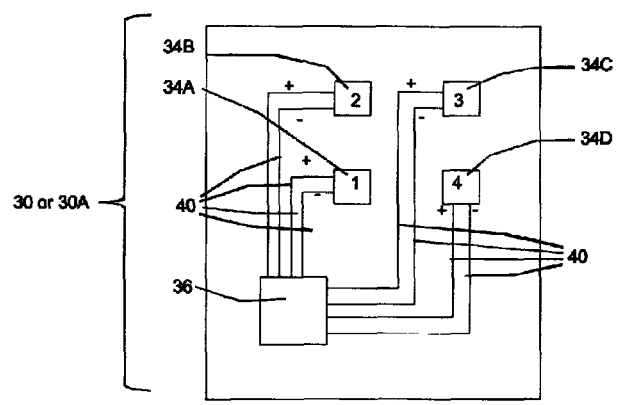
FIG. 9 is a schematic plan view of the LED system having multiple LED chips electrically connected in parallel.
Figure 9A:
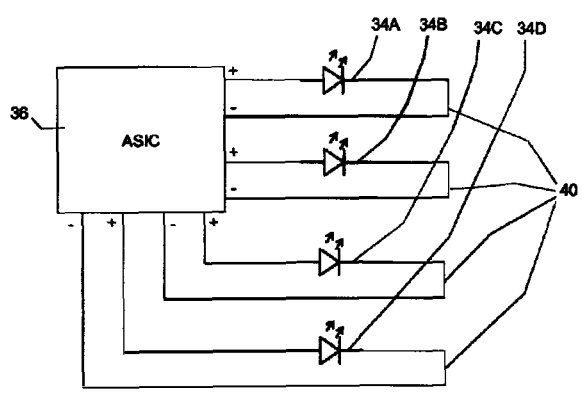
FIG. 9A is a schematic electrical diagram of the LED system of FIG. 9.

Referring to FIGS. 9 and 9A, the LED system 30 or 30A can also include multiple light emitting diodes (LEDs) 34A-34D electrically connected in parallel. As another alternative, the light emitting diodes (LEDs) 34A-34D can be electrically connected in multiple parallel strings with each string containing a plurality of light emitting diodes (LEDs) 34 connected in series.

Figure 10:
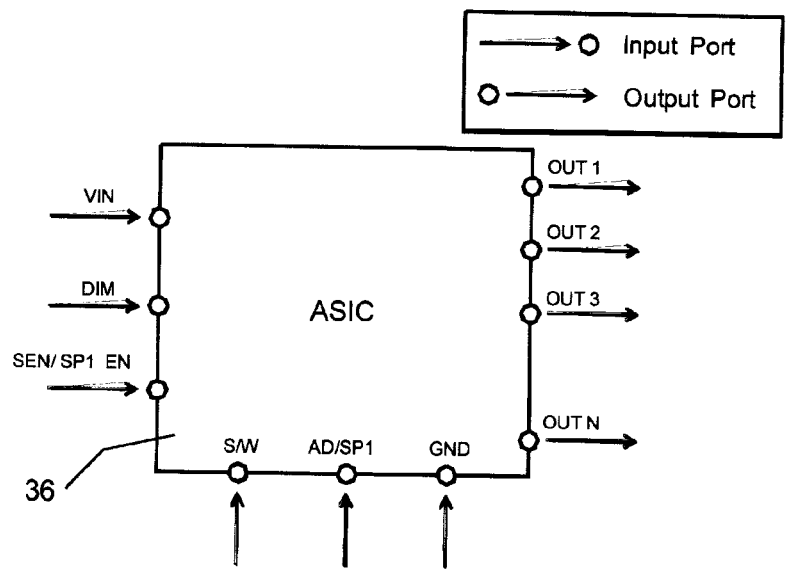
FIG. 10 is an electrical schematic diagram of the application specific integrated circuit (ASIC) of the LED system.
Figure 10A:
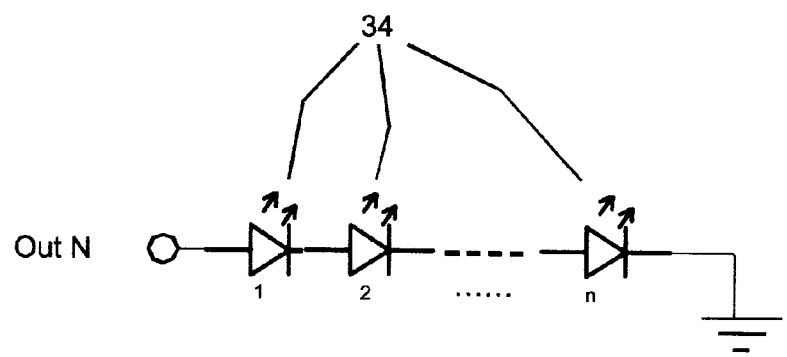
FIG. 10A is an electrical schematic diagram of a first output configuration of the application specific integrated circuit (ASIC) of the LED system.
Figure 10B:
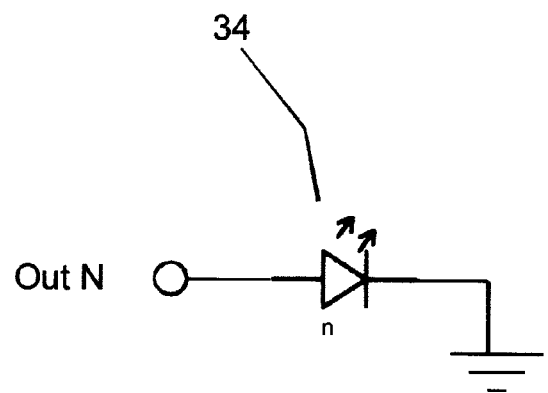
FIG. 10B is an electrical schematic diagram of a second output configuration of the application specific integrated circuit (ASIC) of the LED system.

Referring to FIGS. 10, 10A and 10B, electrical characteristics of the LED system 30 or 30A are illustrated. FIG. 10 illustrates an input/output configuration 44 for the application specific integrated circuit (ASIC) die 36. In general, the input/output configuration and the application specific integrated circuits of the application specific integrated circuit (ASIC) die 36 are configured to integrate the light emitting diode 34 and the application specific integrated circuit (ASIC) die 36 into an integrated assembly. FIG. 10A illustrates an output configuration for the application specific integrated circuit (ASIC) die 36 with a string of light emitting diodes (LED) 34 electrically connected in series to ground. FIG. 10B illustrates an output configuration for the application specific integrated circuit (ASIC) die 36 with a single light emitting diode (LED) 34 electrically connected to ground.

Table 1 describes the input port configuration for the application specific integrated circuit (ASIC) die 36.

TABLE 1

INPUT PORT CONFIGURATION

| PORT | PORT DESCRIPTION |
|---|---|
| Vin | Power Source input for LED Systems. Power input is enable for:<br>a) DC Voltage<br>    Range 1.5 VDC-60 VDAC<br>a) AC Voltage<br>    Range 90 VAC-264 VAC/50 Hz-60 Hz |
| DIM | This is dimming input control port. Dimming is allowed from 0% to 100% brightness. Allow dimming type:<br>a) 0VDC to 10 VDC Type Method<br>b) Pulse Width Modulation<br>c) Convention Triac Dimmer |
| SEN | This port has 2 functions |
| SPI EN | 1) Constant Current Output to LED setting.<br>2) Enable Serial Write to Flash/ROM for White Balance Setting |
| SW | This port is to use for Soft Turn ON/OFF purpose |
| A/D | This port has 2 functions: |
| SPI | 1) Multi-purpose A/D<br>    When SPI En is disable, A/D port function will be enable<br>2) SPI<br>    When SPI EN Port is Enable, LED Brightness Tuning/White Balance Parameter can be burn into Flash/ROM |
| GDN | Common |

Figure 11A:
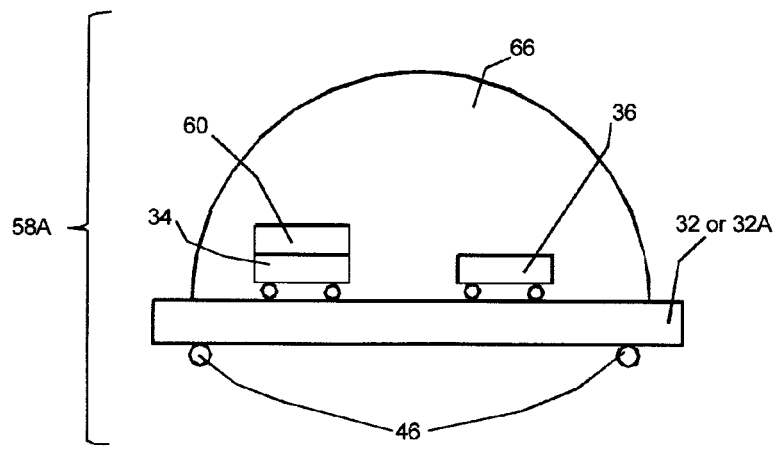
FIG. 11A is a schematic cross sectional view a first encapsulated package for the LED system.

Some features of LED system 30 or 30A include:
Adjustable LED (load) current
LED Output port current can be scaled to multiple ratio for the purpose of:
    White Balancing (for White or RGB applications) or White Color Coordinate Tuning
    Brightness Calibration
Soft Turn On-Off
Dimmable
    Dimming—PWM Dimming—0-10V
Dimming—TRAC
Failsafe System
   Build in Safety Protection
   Over Temperature when Tj>150° C.
   Over Voltage/Overload
   Under voltage lockout
   Reverse polarity protection Referring to FIGS. 11A-11C, different packaging configurations for the LED system 30 or 30A are illustrated. In FIG. 11A, an LED package 58A includes the substrate 32 or 32A, the application specific integrated circuit (ASIC) die 36, and the light emitting diode (LED) 34, substantially as previously described. In addition, the light emitting diode (LED) 34 can include a phosphor layer 60 for producing white light. The LED package 58A also includes a polymer lens 66 on the substrate 32 or 32A, which encapsulates the LED system 30 or 30A. The polymer lens 66 can comprise a suitable polymer such as epoxy formed by molding or other suitable process.

Figure 11B:
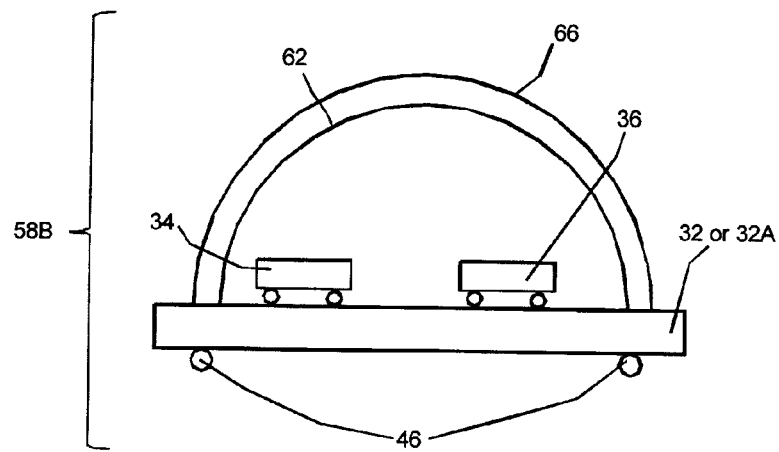
FIG. 11B is a schematic cross sectional view a second encapsulated package for the LED system.

In FIG. 11B, an LED package 58B includes the substrate 32 or 32A, the application specific integrated circuit (ASIC) die 36, and the light emitting diode (LED) 34, substantially as previously described. The LED package 58A also includes a polymer lens 66 on the substrate 32 or 32A which encapsulates the LED system 30 or 30A. In this embodiment, the polymer lens 66 also includes a phosphor layer 62 for producing white light.

Figure 11C:
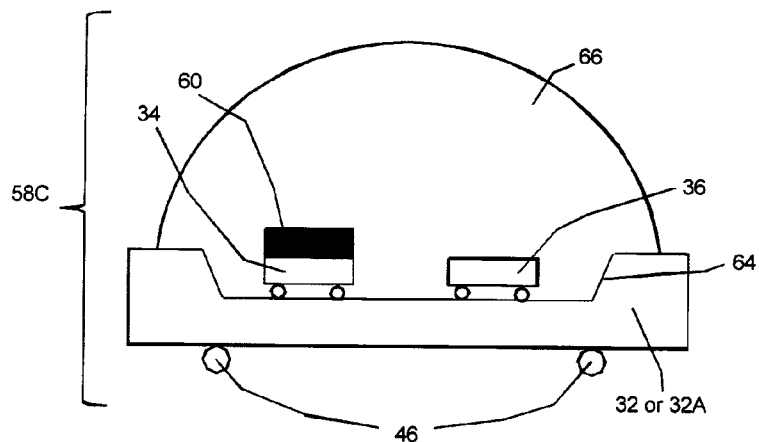
FIG. 11C is a schematic cross sectional view a third encapsulated package for the LED system.

In FIG. 11C, an LED package 58C includes the substrate 32 or 32A, the application specific integrated circuit (ASIC) die 36, and the light emitting diode (LED) 34, substantially as previously described. In this embodiment, the substrate 32 or 32A also includes a reflective recess 64 wherein the application specific integrated circuit (ASIC) die 36, and the light emitting diode (LED) 34 are mounted.

Figure 1:
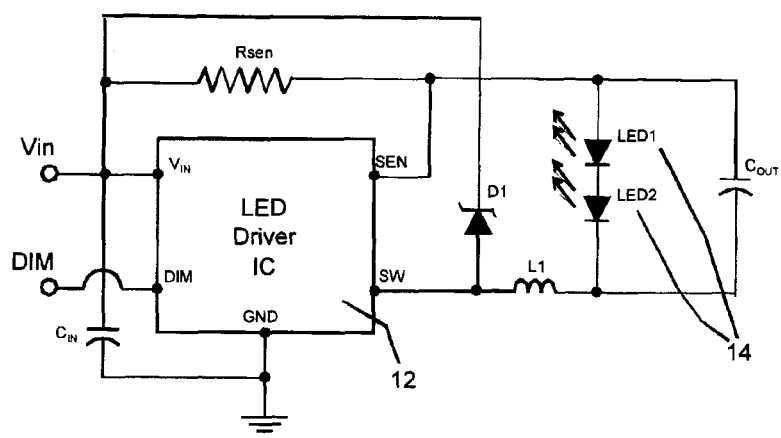
FIG. 1 is an electrical schematic diagram of a prior art LED system.
Figure 12:
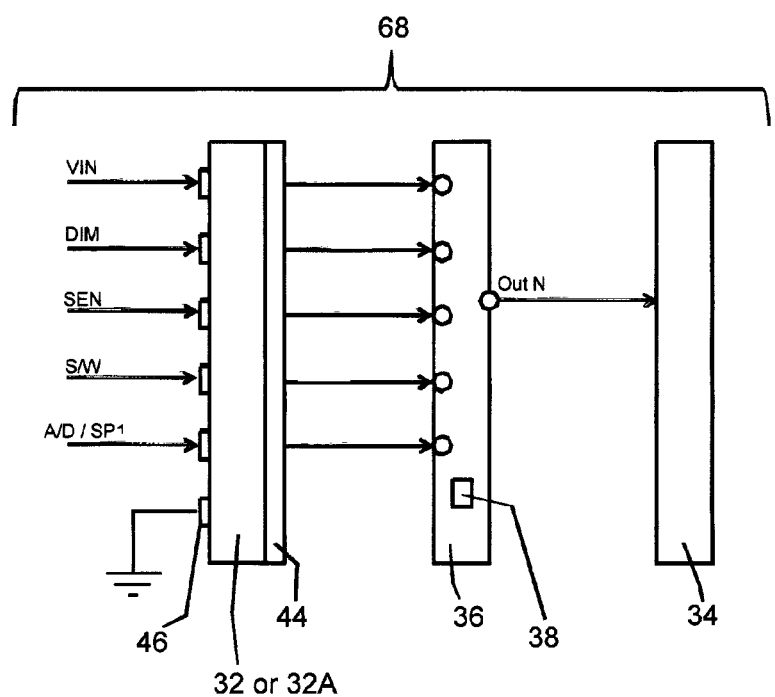
FIG. 12 is an electrical schematic diagram of a LED integrated circuit formed by the LED system.

Referring to FIG. 12 an electrical schematic of an LED integrated circuit 68 formed by the LED system 30 or 30A is illustrated. The LED integrated circuit 68 includes the contacts 46 on the substrate 32 or 32A. The LED integrated circuit 68 can also include the application specific integrated circuits 44 on the substrate 32A. The LED integrated circuit 68 also includes the application specific integrated circuits 38 in the application specific integrated circuit (ASIC) die 36. The LED integrated circuit 68 also includes the light emitting diode 34. Because the LED integrated circuit 68 has integrated elements power consumption and heat generation are less than with the prior art LED circuit 10 (FIG. 1). In addition, the LED system 30 or 30A can be made smaller such that a chip scale system can be provided.

Thus the disclosure describes improved LED systems. While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A light emitting diode (LED) system comprising:
   a semiconductor substrate comprising a plurality of external contacts;
   one or more application specific integrated circuits (ASIC) comprising at least one semiconductor component integrated in the semiconductor substrate in electrical communication with the external contacts and a die on the semiconductor substrate in electrical communication with the application specific integrated circuits (ASIC); and
   at least one light emitting diode (LED) on the semiconductor substrate in electrical communication with the die;
   the semiconductor substrate, the external contacts, the application specific integrated circuits (ASIC) and the light emitting diode (LED) configured as an integrated LED circuit,
   with the external contacts configured as multi-purpose input-output ports configured to control electrical functions of the application specific integrated circuits (ASIC), the die, and the light emitting diode (LED) including power input, dimming control, current setting, feedback sensing, communication and common ground.

2. The system of claim 1 wherein the semiconductor component comprises an element selected from the group consisting of resistors, diodes, capacitors, gates, metal-oxide field effect transistors (MOSFET) and flip flops.

3. The system of claim 1 wherein the die comprises an application specific integrated circuits (ASIC) die.

4. The system of claim 1 wherein the semiconductor substrate comprises a portion of a semiconductor wafer and the die is mounted to a blank portion of the semiconductor substrate.

5. The system of claim 1 wherein the light emitting diode (LED) comprises a Group-III nitride based material.

6. The system of claim 1 wherein the semiconductor substrate comprises Si.

7. A light emitting diode (LED) system comprising:
   a semiconductor substrate comprising at least one integrated semiconductor component and a plurality of external contacts in electrical communication with the semiconductor component;
   at least one application specific integrated circuit (ASIC) die on the semiconductor substrate having a plurality of integrated circuits;
   at least one light emitting diode (LED) on the semiconductor substrate in electrical communication with the application specific integrated circuit (ASIC) die comprising a Group-III nitride based material;
   the semiconductor substrate, the external contacts and the integrated circuits configured to integrate the application specific integrated circuit (ASIC) die and the light emitting diode (LED) into an integrated LED circuit,
   with the external contacts configured as multi-purpose input-output ports configured to control electrical functions of the application specific integrated circuit (ASIC) die, the integrated circuits and the light emitting diode (LED) including power input, dimming control, current setting, feedback sensing, communication and common ground.

8. The system of claim 7 wherein the Group-III nitride based material comprises a material selected from the group consisting of GaN, InGaN, AlGaN and AlInGaN.

9. The system of claim 7 wherein the semiconductor substrate comprises Si.

10. The system of claim 7 wherein the light emitting diode (LED) comprises a vertical light emitting diode (VLED) die.

11. The system of claim 7 wherein the light emitting diode (LED) includes a device substrate comprising a material selected from the group consisting of Si, GaAs, SiC, AlN, $Al_2O_3$, and sapphire.

12. The system of claim 7 wherein the Group-III nitride based material comprises GaN and the device substrate comprises SiC.

13. The system of claim 7 wherein the application specific integrated circuit (ASIC) die comprises a plurality of dice.

14. A light emitting diode (LED) system comprising:
a semiconductor substrate comprising a plurality of integrated semiconductor components and a plurality of external contacts in electrical communication with the semiconductor components configured as terminal contacts for electrically connecting the system to an outside world, the semiconductor components comprising an element selected from the group consisting of resistors, diodes, capacitors, gates, metal-oxide field effect transistors (MOSFET) and flip flops;
an application specific integrated circuit (ASIC) die on the semiconductor substrate having a plurality of input ports in electrical communication with the semiconductor devices and the external contacts, a plurality of integrated circuits in electrical communication with the input ports, and at least one output port in electrical communication with the integrated circuits;
at least one light emitting diode (LED) mounted to the semiconductor substrate in electrical communication with the output port comprising a Group-III nitride based material;
the semiconductor substrate, the external contacts, the semiconductor components on the semiconductor substrate, and the integrated circuits on the application specific integrated circuit (ASIC) die configured to form an integrated LED circuit configured to transmit input from the outside world to the application specific integrated circuit (ASIC) die,
with the external contacts configured as multi-purpose input-output ports configured to control electrical functions of the application specific integrated circuit (ASIC) die, the integrated circuits and the light emitting diode (LED) including power input, dimming control, current setting, feedback sensing, communication and common ground.

15. The system of claim 14 wherein the Group-III nitride based material comprises a material selected from the group consisting of GaN, InGaN, AlGaN and AlInGaN.

16. The system of claim 14 wherein the light emitting diode (LED) comprises a vertical light emitting diode (VLED) die.

17. The system of claim 14 wherein the light emitting diode (LED) includes a device substrate comprising a material selected from the group consisting of Si, GaAs, SiC, AlN, $Al_2O_3$, and sapphire.

18. The system of claim 14 wherein the application specific integrated circuit (ASIC) die comprises a plurality of dice.

* * * * *